US010436837B2

(12) United States Patent
Bhagat et al.

(10) Patent No.: US 10,436,837 B2
(45) Date of Patent: Oct. 8, 2019

(54) AUTO TEST GROUPING/CLOCK SEQUENCING FOR AT-SPEED TEST

(71) Applicant: GLOBALFOUNDRIES Inc., Grand Cayman (KY)

(72) Inventors: Hardik P. Bhagat, Kalyan Nagara Post (IN); Mark R. Taylor, Essex Junction, VT (US); Baalaji Konda Ramamoorthy, Bangalore (IN); Douglas E. Sprague, Ellsworth, ME (US); Greeshma Jayakumar, Ernakulam (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 232 days.

(21) Appl. No.: 14/886,739

(22) Filed: Oct. 19, 2015

(65) Prior Publication Data
US 2017/0108549 A1    Apr. 20, 2017

(51) Int. Cl.
G01R 31/317    (2006.01)
G01R 31/327    (2006.01)

(52) U.S. Cl.
CPC .............. *G01R 31/31727* (2013.01)

(58) Field of Classification Search
CPC .......... G01R 31/31727; G01R 31/3177; G01R 31/318342; G01R 31/318502; G01R 31/318321
See application file for complete search history.

(56) References Cited

U.S. PATENT DOCUMENTS

| 7,389,095 | B1* | 6/2008 | Liu ................... H04B 15/02 331/16 |
| 7,500,164 | B2 | 3/2009 | Chelstrom et al. |
| 7,958,285 | B1 | 6/2011 | Chiu et al. |
| 8,209,141 | B2 | 6/2012 | Bassett et al. |
| 8,527,824 | B2* | 9/2013 | Bahl ............. G01R 31/318594 714/729 |
| 8,538,718 | B2 | 9/2013 | Grise et al. |
| 8,825,433 | B2 | 9/2014 | Baalaji et al. |
| 2004/0263223 | A1* | 12/2004 | Wong ................... G06F 1/04 327/156 |
| 2005/0144497 | A1* | 6/2005 | Song ................... G06F 1/10 713/503 |
| 2005/0240847 | A1* | 10/2005 | Nadeau-Dostie ........................... G01R 31/31922 714/726 |

(Continued)

OTHER PUBLICATIONS

Disclosed Anonymously, "Enhanced test clock control structure to improve coverage & ATPG efficiency for designs having multiple partitions", Nov. 1, 2013, IP.com No. IPCOM000232339D, 7 pages.

(Continued)

Primary Examiner — Cynthia Britt
Assistant Examiner — Dipakkumar B Gandhi
(74) Attorney, Agent, or Firm — Michael Le Strange; Andrew M. Calderon; Roberts Mlotkowski Safran Cole & Calderon, P.C.

(57) ABSTRACT

A method includes: defining a plurality of clock architecture attributes for a plurality of clock domains to be tested; assigning each one of the plurality of clock domains to a first test group; and refining the assignment of each one of the plurality of clock domains based on the plurality of clock architecture attributes until each of the plurality of clock domains is grouped into a current test group.

20 Claims, 9 Drawing Sheets

(56) References Cited

U.S. PATENT DOCUMENTS

| | | |
|---|---|---|
| 2006/0190754 A1 | 8/2006 | Dargelas et al. |
| 2008/0010572 A1* | 1/2008 | Sul .................. G01R 31/318552 714/731 |
| 2008/0150605 A1* | 6/2008 | Chueh ....................... G06F 1/10 327/292 |
| 2009/0083594 A1 | 3/2009 | Chelstrom et al. |
| 2011/0066904 A1* | 3/2011 | Lackey .......... G01R 31/318594 714/726 |
| 2011/0235459 A1* | 9/2011 | Ware ........................ G11C 7/04 365/233.11 |
| 2012/0002707 A1* | 1/2012 | Yamasaki ............... H03L 7/099 375/219 |
| 2012/0150473 A1* | 6/2012 | Grise ............... G01R 31/31726 702/117 |
| 2012/0166860 A1* | 6/2012 | Khullar .......... G01R 31/318552 713/501 |
| 2012/0173943 A1 | 7/2012 | Cesari |
| 2013/0080108 A1* | 3/2013 | Baalaji ............. G01R 31/31726 702/123 |
| 2013/0103994 A1* | 4/2013 | Tekumalla ..... G01R 31/318558 714/726 |
| 2014/0075257 A1 | 3/2014 | Wang et al. |
| 2015/0137862 A1* | 5/2015 | Bahl .............. G01R 31/318552 327/145 |

OTHER PUBLICATIONS

Disclosed Anonymously, "Scan Clock Distribution Using One Single Clock Input Pin", Jun. 4, 2008, IP.com No. IPCOM000171318D, 5 pages.

* cited by examiner

AUTO TEST GROUPING/CLOCK SEQUENCING FOR AT-SPEED TEST

FIELD OF THE INVENTION

The present disclosure relates to auto test grouping/clock sequencing for at-speed test and, more particularly, to auto test grouping/clock sequencing for at-speed test using domain crossing and clock architectures and methods of use.

BACKGROUND

With smaller geometry of fabrication process, the number and type of defects on a chip increase exponentially. Considering the number of different faults on a given chip, more number of patterns is needed to target these smaller geometry faults. This leads to the need for efficient pattern generation techniques on any nanometer chip. But obtaining satisfactory coverage for transition delay test, with limited test pattern count, is a challenge. For example, with limited memory on the tester, the number of test patterns cannot be increased to achieve higher test coverage.

Inefficient test grouping/clock sequencing may result in inefficient pattern allocation and higher test coverage in some of the At-Speed Test groups, while providing poor coverage numbers for other test groups, long pattern generation time (ATPG) and wrong test failures on real hardware due to incorrect domain crossings. Inefficient test grouping/clock sequencing may further result in increased power droop in one group versus other groups, depending on the number of active faults, as well as a reduction in coverage on domain crossings.

Also, currently At-Speed test-groups and clock sequencing are created by hand with no well defined process. For example, clock designers will manually create test-groups/clock sequence per certain guidelines. This manual process is tedious, time consuming and error prone. Also, asynchronous domains fail on the tester if they communicate. And, in a test group, there are additional constraints driving the separation of certain clocking elements that could increase power drooping if tested together, which may be overlooked in manual processes. For example, grouping multiple PLLs in a same test group may cause characterization issues if they cannot be handled by the same reference clock.

SUMMARY

In an aspect of the disclosure, a method includes: defining a plurality of clock architecture attributes for a plurality of clock domains to be tested; assigning each one of the plurality of clock domains to a first test group; and refining the assignment of each one of the plurality of clock domains based on the plurality of clock architecture attributes until each of the plurality of clock domains is grouped into a current test group.

In an aspect of the disclosure, a computer program product includes a computer readable storage medium having program instructions embodied therewith. The program instructions executable by a computing device to cause the computing device to: tabulate, by the computing device, clock architecture attributes for all clock domains associated with a test; mark, by the computing device, all clock domains with an UNPROGRAMMED attribute; place, by the computing device, all UNPROGRAMMED clock domains into one single unique test group and mark all of them with a PROGRAMMED attribute; and refine the unique test group into a current test group, by the computing device, based on the clock architecture attributes until all of the clock domains to be tested are PROGRAMMED and marked as completed.

In an aspect of the disclosure, a system includes: a CPU, a computer readable memory and a computer readable storage medium; program instructions to tabulate clock architecture attributes for all clock domains associated with a test; program instructions to place all UNPROGRAMMED clock domains into one test group; and program instructions to refine the test group into a current test group based on different clock architecture attributes. The program instructions are stored on the computer readable storage medium for execution by the CPU via the computer readable memory.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
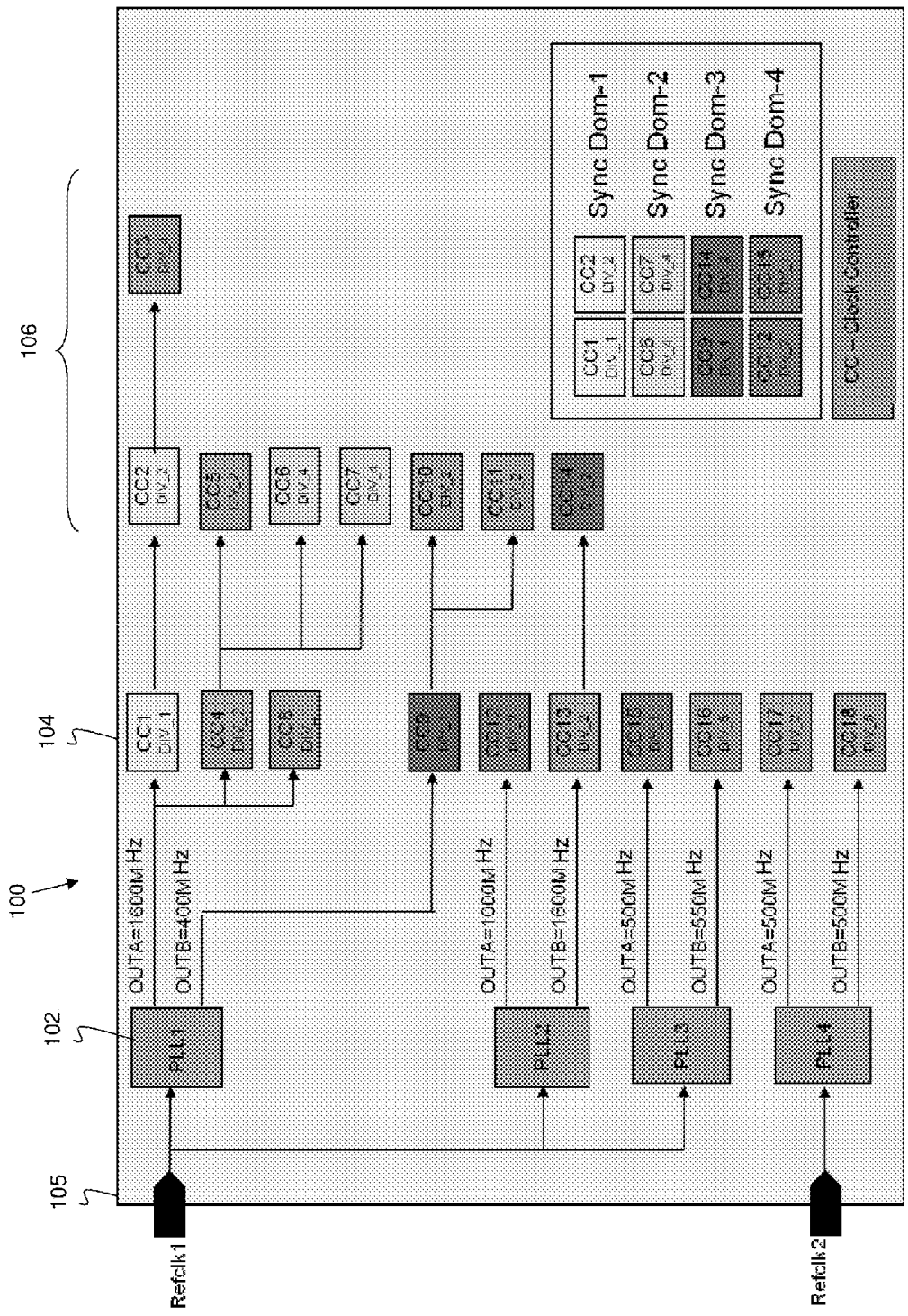
FIG. 1 shows an exemplary clock architecture which can be used when implementing the systems and processes in accordance with aspects of the present disclosure.

The present disclosure relates to auto test grouping/clock sequencing for at-speed test and, more particularly, to auto test grouping/clock sequencing for at-speed test using domain crossing and clock architectures and methods of use. More specifically, the present disclosure provides processes and structures for an automated method for auto-generation of test groups for At-Speed Structural Test (ASST) using electronic design automation (EDA) tools such as automated test pattern generation (ATPG) tools, which generate "domain crossing file" and "Clock architecture file". In using the EDA tools, the processes and systems described herein can use domain crossings between different clock domains along with their fencing information, as well as information about the number of nodes/faults driven by each clock domain.

As should be recognized by those of ordinary skill in the art, "domain crossing file" has information about domain crossing between different clock domains along with their fencing information, as well as information about number of nodes driven by each clock domain. On the other hand, "Clock architecture file" has information about clock architecture of the design, including frequency of operation of each clock domain.

In embodiments, the processes described herein use reference clock (REFCLK) and Phase Lock Loop (PLL) source pin information from the Clock architecture file to identify Test Clock Controller (TCC) being driven by different REFCLKs. These different REFCLKs can be placed in the same test group. For all TCC, the processes will identify other TCC operating at the same frequency from the same PLL source and check domain crossing/fencing information in the "domain crossing file" in order to find a list of other TCC, which may be tested under the same test group. By understanding the synchronous domain information FENCING/domain crossing information from the "domain crossing file", the processes can thus identify a test group, which can be tested using "PULSE & FENCES UP" or "STIMS & FENCES DOWN" as further defined and described herein.

Continuing with the processes, using Parent(fast)-Child (slow) relationship of TCC from the Clock architecture file, the processes will remove children from the above groups, and place them in a test group that will only include the parent ($2^{nd}$ pass) and child. These can be included in a test group that could test all the child domains together. If the parent and the child are tested at the same speed, PULSES could be used as further defined and described herein; whereas, if the parent and child are tested at a different frequency, parent fast, child slow, STIM (clock STIMS) will be used as further defined and described herein. The process can calculate the number of nodes driven by all these TCC under the same test group and (i) if a single TCC is driving a very high number of nodes, further split them is not possible and (ii) if the number of nodes is greater than 20% of total nodes as one example of a user's choice, then the processes can split the test group in two test groups. The above processes are performed until all parent TCCs with different frequency settings are covered and all children TCC are covered.

Accordingly, the processes and systems disclosed herein provide a well defined process for generation of test groups/clock sequence for transition delay test, using domain crossing information and clock architecture information, with reduced power drooping. Also, the present disclosure provides a solution for creating test groups and achieving better coverage with fewer pattern counts than conventional systems creating At-Speed test-groups and clock sequencing manually.

Definitions

It should be understood by those of skill in the art that the following definitions are provided as examples and other terms can be used for the same concepts and/or attributes without departing from the scope of the present invention.

Test Groups: A collection of different clock domains that can be logically or physically tested together.

Fence: A logic circuit that blocks or enables capture on a path meant to be controlled during test.

Synchronous Clocks: More than one unique domain that has a same clock attribute in terms of frequency, divider setup, slew and duty cycle. One of skill in the art would understand that domains may have asynchronous clock relationship, but still close timing on capture sequence of the at speed test in cross domain paths.

Asynchronous Domains: More than one unique clock domain with unique clock attributes in terms of frequency, divider setup and duty cycle. One of skill in the art would understand that two or more asynchronous domains have fence control circuit on synchronous paths across clock domains.

Safe Domains: Two or more domains which do not communicate across domains would be considered safe during test.

PROGRAMMED: A test group or clock sequence in which a given clock controller is active and faults under that domain will be targeted.

UNPROGRAMMED: A test group or clock sequence in which a given clock controller is inactive and faults under that domain will not be targeted.

CASCADING: An attribute that can give information if the current clock controller is fed by any other clock controller or is feeding any other clock controller. This helps in understanding the cascading behavior of clock controller.

PLL_SOURCE: An attribute that provides information about the PLL source of the give clock controller.

REFCLK: An attribute that provides information about the reference clock of the given PLL.

FREQUENCY: An attribute that provides information about the frequency of operation of the PLL when current clock controller is active/PROGRAMMED.

DIVISION: An attribute that provides information about the division performed by a current clock controller when it is active/PROGRAMMED.

SYNCHRONOUS: An attribute that provides information about synchronous behavior between any two clock controllers.

FENCING: An attribute that provides information about presence of fencing logic between any two clock controllers.

No_of_Faults: An attribute that provides information about number of active faults when give clock controller is active/PROGRAMMED.

PULSE: A type of clocking sequence where an ATPG engine does not understand the edge relationship between one clock (on which it is operating) with other clocks. It assumes that the generated clock does not have a relationship with other clock domains and produces a single (for LOS) or more than one (for LOC) clock pulse for pattern generation.

STIMS: A type of clocking sequence where the ATPG engine understands the edge relationship between one clock (on which it is operating) with other clocks. It will calculate the edge relationship between two clocks and produces a single (for LOS) or more than one (for LOC) clock pulse for pattern generation Architecture FIG. 1 shows an exemplary clock architecture which can be used when implementing the systems and processes in accordance with aspects of the present disclosure. It should be understood by those of ordinary skill in the art that the exemplary clock architecture 100 of FIG. 1 is provided as an illustrative example and that other clock architectures can be implemented with the systems and processes in accordance with aspects of the present disclosure. It should also be understood by those of ordinary skill in the art that the clock architecture of FIG. 1 can be obtained by known EDA tools, which generate "domain crossing file" and "Clock architecture file". In embodiments, the EDA tools provide information about the clock architecture design in text/tabular format, including frequency of operation of each clock domain along with other details.

More specifically, FIG. 1 shows a plurality of PLLs 102 (e.g., PLL1, PLL1-PLL4) connected to a plurality of reference clocks (REFCLK) 105 (e.g., REFCLK1 and REFCLK2). The PLLs 102 connect to a plurality of different clock controllers represented at reference numerals 104 and 106 (CC1-CC18), with different frequency of operations for different clock domains. In embodiments, clock controllers 104 are parent clock controllers and clock controllers 106 are children clock controllers, e.g., children to clock controllers 104. In this example, (i) clock controllers CC1, CC4 and CC8 have frequency of operation for a clock domain at 1600 MHz;

(ii) clock controller CC9 has a frequency of operation for a clock domain at 400 MHz;

(iii) clock controller CC12 has a frequency of operation for a clock domain at 1000 MHz;

(iv) clock controller CC12 has a frequency of operation for a clock domain at 1600 MHz;

(v) clock controller CC15 has a frequency of operation for a clock domain at 500 MHz;

(vi) clock controller CC15 has a frequency of operation for a clock domain at 500 MHz;

(vii) clock controller CC16 has a frequency of operation for a clock domain at 500 MHz;

(viii) clock controller CC17 has a frequency of operation for a clock domain at 500 MHz; and (ix) clock controller CC18 has a frequency of operation for a clock domain at 500 MHz.

FIG. 1 further shows the divisions performed by current clock controllers when they are active/PROGRAMMED. For example, CC1 has a division of 1 (e.g., DIV_1). FIG. 1 further shows that different clock controllers are synchronized in different domains. For example, (i) CC1 and CC2 are synchronized in Dom-1, (ii) CC6 and CC7 are synchronized in Dom-2, (iii) CC9 and CC14 are synchronized in Dom-3, and (iv) CC12 and CC15 are synchronized in Dom-4.

Figure 2:
FIG. 2 shows fencing information for the clock architecture of FIG. 1.

FIG. 2 shows fencing information for the clock architecture of FIG. 1. In particular, chart 200 of FIG. 2 shows which clock controllers of FIG. 1 are fenced, unfenced, safe and not safe in accordance with aspects of the present disclosure. The fences can be any combinational/sequential logic, which can be used for blocking a data path from one clock domain to another clock domain. Fencing can be the process in which some control signals can be used to control fencing logic (FENCES) to enable/disable data crossing from one clock domain to another. Also, as already described herein, a safe mode is when two or more domains which do not communicate across domains are considered safe during test.

By using the clock architecture and the fencing logic of FIGS. 1 and 2, the processes and systems described herein can create the test groups shown in Table 1, below.

TABLE 1

| Experiment No. | Clock Controller Programmed | Type of Capture Clocks |
| --- | --- | --- |
| Test_all_1 | 1, 4, 8, 9*, 12*, 13*, 15*, 16*, 17, 18 | At-speed Capture Pulses |
| Test_all_2 | 2, 5, 10, 11, (1, 4, 9) | At-speed Capture Pulses |
| Test_all_3 | 3, 7, 14, (1, 2, 4, 13) | At-speed Capture Pulses |

TABLE 1-continued

| Experiment No. | Clock Controller Programmed | Type of Capture Clocks |
| --- | --- | --- |
| Test_all_4 | 6, (4) | At-speed Capture Pulses |
| Test_all_5 | 6, 7, 9, 14, 12*, 15, (4, 13) | At-speed Capture Stims |

*Is the condition under which reference clocks can be correctly merged (if reference clock cannot be merged, CC cannot be programmed in the same test group)
**Clock Controllers in the ( ) are the parent clock controller which needs to programmed for testing of children More specifically, by using the following processes, it is possible to create the test groups shown in Table 1, compared to the test groups shown in Table 2 which were tabulated using conventional systems. Generally, the processes start with tabulating the clock architecture attributes for all clock domains (REFCLK, FREQ, PLL_SOURCE, FENCING, CASCADING, SYNC, NODES). All of the clock domains with UNPROGRAMMED attribute are then marked. After the clock domains are marked with UNPROGRAMMED attributes, the different attributes can be tested in test groups in order to form a current group. For example, the processes can proceed as following:

(i) place all UNPROGRAMMED clock domains into one single unique test group and mark all with PROGRAMMED attribute;

(ii) refine the current test group based on CASCADING attributes;

(iii) refine the current test group based on PLL_SOURCE/REFCLK/FREQ/DIVISION attributes;

(iv) refine the current test group based on SYNCHRONOUS attributes;

(v) refine the current test group based on FENCING attribute; and (vi) refine the current test group based on "Number of FAULTS" attribute.

The steps (i)-(vi) can be repeated until all of the clock domains are programmed. The steps (i)-(vi) can vary in order without significantly affecting the results of the final test groups.

In comparison, the groupings shown in Table 2 were created by conventional processes. The conventional processes, though, provide significantly more groupings, which leads to inefficiencies in the testing processes as described herein.

TABLE 2

| Experiment Name | Clock Controller Programmed |
| --- | --- |
| Testgroup_1 | CC1 |
| Testroup_2 | CC2, CC1 |
| Testgroup_3 | CC3, CC2, CC1 |
| Testgroup_4 | CC4 |
| Testgroup_5 | CC5, CC4 |
| Testgroup_6 | CC6, CC4 |
| Testgroup_7 | CC7, CC4 |
| Testgroup_8 | CC8 |
| Testgroup_9 | CC9 |
| Testgroup_10 | CC9, CC10 |
| Testgroup_11 | CC9, CC11 |
| Testgroup_12 | CC12 |
| Testgroup_13 | CC13 |
| Testgroup_14 | CC13, CC14 |
| Testgroup_15 | CC15 |
| Testgroup_16 | CC16 |
| Testgroup_17 | CC17 |
| Testgroup_18 | CC18 |

More specifically and by comparison between Table 1 and Table 2, the test groups created by the processes and system described herein and shown in Table 1 are significantly less than that shown in Table 2. To this end, one of ordinary skill in the art would recognize the use of the grouping shown in FIG. 1 would be more efficient as tester time is directly proportional to the number of experiments (test group) and number of test vectors. Also, one of ordinary skill in the art would recognize that test power is directly proportional to the number of active partitions of logic and fault density and the number of test shift cycles spent to cover the faults in the design. Thus, the results shown in Table 1 would be a more efficient use of tester time and power. That is, the processes and systems as implemented herein provide more efficient test grouping/clock sequence for (i) reduction in test data volume on the tester, (ii) reduction in test application time on the tester and (iii) reduction of test pattern simulation time on a simulator. Also, the processes described herein provide a significant reduction in pattern generation time as well as better coverage with fewer pattern counts.

Exemplary Processes

FIGS. 3-8 show exemplary flows for performing aspects of the present disclosure. The steps of FIGS. 3-8 may be implemented in the environment of FIG. 9, for example. As noted herein, the flowchart(s) illustrate the architecture, functionality, and operation of possible implementations of systems, methods, and computer program products according to various embodiments of the present disclosure. In this regard, each block in the flowchart may represent a module, segment, or portion of instructions, which comprises one or more executable instructions for implementing the specified logical function(s). In some alternative implementations, the functions noted in the block may occur out of the order noted in the figures. For example, referring to FIG. 3, each of the steps 310 to 335 can be performed in any sequence without significantly affecting the outcome. It will be understood that each block of the flowchart illustrations and/or block diagrams, and combinations of blocks in the flowchart illustrations and/or block diagrams, can be implemented by computer readable program instructions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Figure 3:
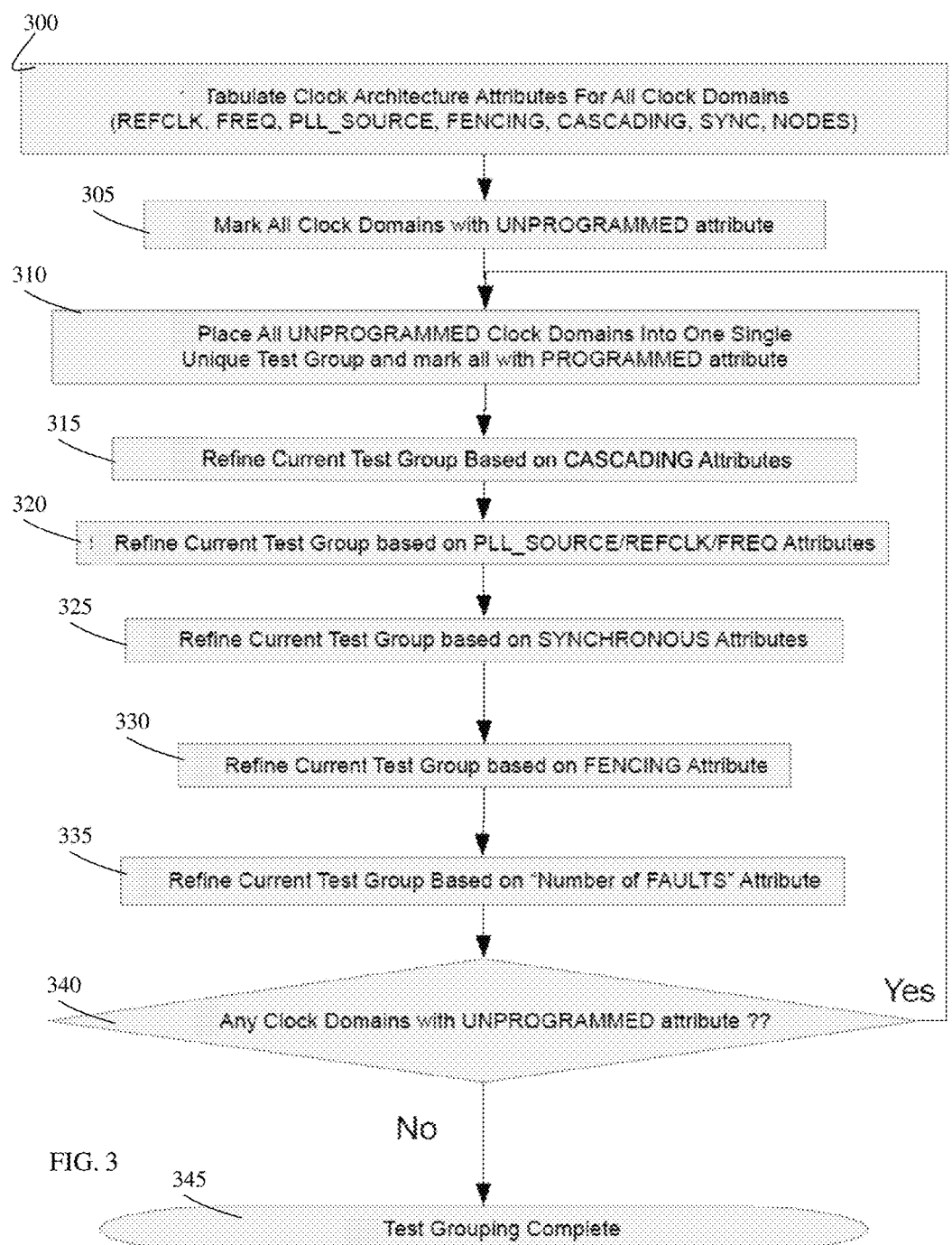
FIG. 3 depicts an exemplary general flow for a process in accordance with aspects of the present disclosure.

FIG. 3 depicts an exemplary flow for a general process in accordance with aspects of the present disclosure. At step 300, the processes tabulate clock architecture attributes for all clock domains. These clock architecture attributes include, e.g., REFCLK, FREQ, PLL_SOURCE, FENCING, CASCADING, SYNC, NODES. At step 305, the processes mark all clock domains with the UNPROGRAMMED attribute. At step 310, the processes place all UNPROGRAMMED clock domains into one single unique test group (e.g., first test group) and mark all with the PROGRAMMED attribute. At step 315, the processes refine the current test group (e.g., single unique test group) based on CASCADING attributes (see, e.g., FIG. 4). At step 320, the processes refine the current test group based on PLL_SOURCE/REFCLK/FREQ attributes (see, e.g., FIG. 5). At step 325, the processes refine the current test group based on SYNCHRONOUS attributes (see, e.g., FIG. 6). At step 330, the processes refine the current test group based on FENCING attributes (see, e.g., FIG. 7). At step 335, the processes refine the current test group based on "Number of FAULTS" attributes (see, e.g., FIG. 8). At step 340, the processes determine whether any clock domain has UNPROGRAMMED attributes. If yes, the processes revert to step 315. If all of the clock domains are PROGRAMMED, then the processes continue to step 345, where the test grouping is marked as complete.

Figure 4:
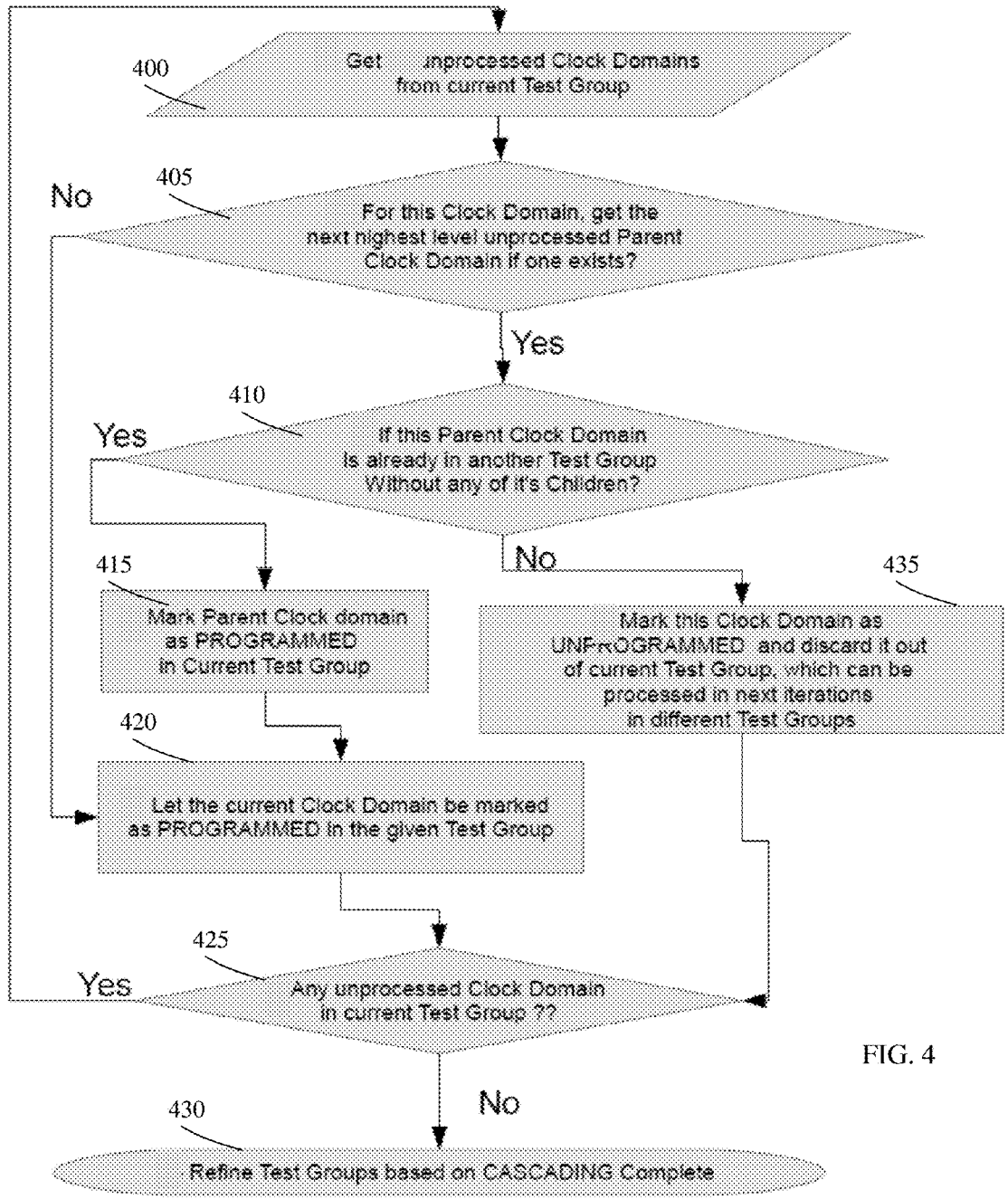
FIG. 4 depicts an exemplary flow for refining a current test group based on CASCADING attributes in accordance with aspects of the present disclosure.

FIG. 4 depicts an exemplary flow for refining the current test group based on CASCADING attributes in accordance with aspects of the present disclosure. At step 400, the processes obtain an unprocessed clock domain from the current test group. At step 405, the processes determine whether next highest level unprocessed parent clock domain exists for this clock domain. If not, the process continues to step 420.

If the next highest level unprocessed parent clock domain exists, at step 410, the processes determine whether this parent clock domain is already in another test group without any of its children. If yes, the processes continue to step 415, where the parent clock domain is marked as PROGRAMMED in the current test group. The processes continue to step 420, where the current clock domain is marked as PROGRAMMED in the given test group. At step 425, the processes determine whether there are any unprocessed clock domains in the current test group. If yes, the processes revert to step 400. If there are no unprocessed clock domains in the current test group, then the processes continue to step 430, where the refinement of the test groups based on CASCADING is marked as complete.

Returning to step 410 of FIG. 4, if the parent clock domain is not already in another test group without any of its children, then the processes continue to step 435. At step 435, the processes mark this clock domain as UNPROGRAMMED and discard it out of the current test group, which can be processed in next iterations in different test groups. The process then continues to step 425.

Figure 5:
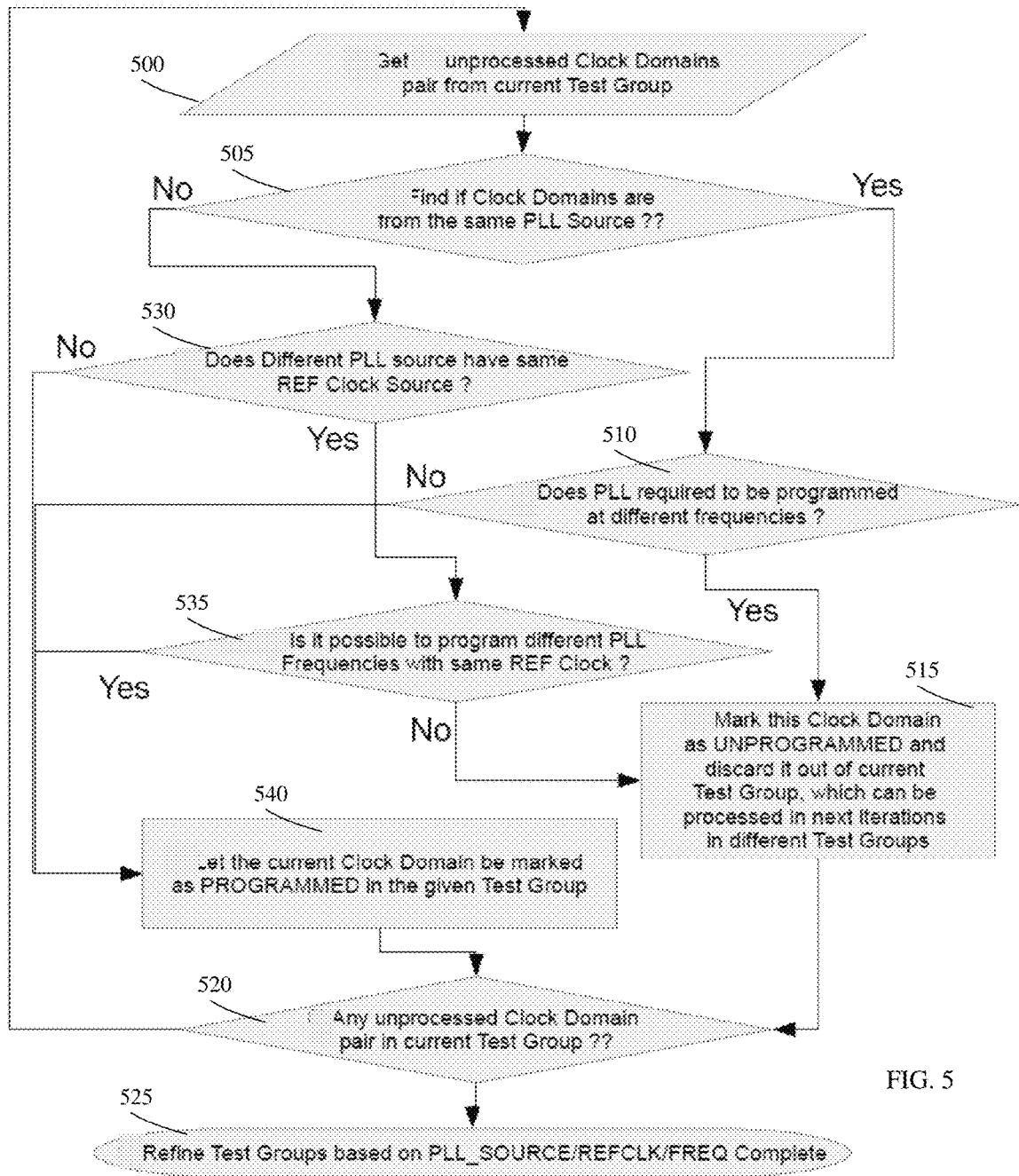
FIG. 5 depicts an exemplary flow for refining a current test group based on PLL_SOURCE/REFCLK/FREQ attributes in accordance with aspects of the present disclosure.

FIG. 5 depicts an exemplary flow for refining a current test group based on PLL_SOURCE/REFCLK/FREQ attributes in accordance with aspects of the present disclosure. At step 500, the processes obtain an unprocessed clock domains pair from the current test group. At step 505, the processes determine whether clock domains are from the same PLL source. If yes, the processes continue to step 510, where a determination is made whether the PLLs are required to be programmed at different frequencies. If yes, then at step 515, the processes mark this clock domain as UNPROGRAMMED and discard it out of current the test group, which can be processed in next iterations in different test groups. At step 520, the processes will determine whether there is any unprocessed clock domain pair in the current test group. If yes, the processes will revert to step

500. If not, then the processes will continue at step 525 where the refinement of the test groups based on ALL_SOURCE/REFCLK/FREQ is marked as complete.

Returning to step 505 of FIG. 5, if there are no clock domains from the same PLL source, the processes will continue to step 530. At step 530, a determination is made as to whether the different PLL source has the same REF clock source. If yes, the processes will continue to step 535, where a determination is made as to whether it is possible to program different PLL frequencies with the same REF clock. If no, the process will continue to step 515. If yes, the process will continue to step 540. At step 540, the processes will let the current clock domain be marked as PROGRAMMED in the given test group. The processes will then continue to step 520.

Figure 6:
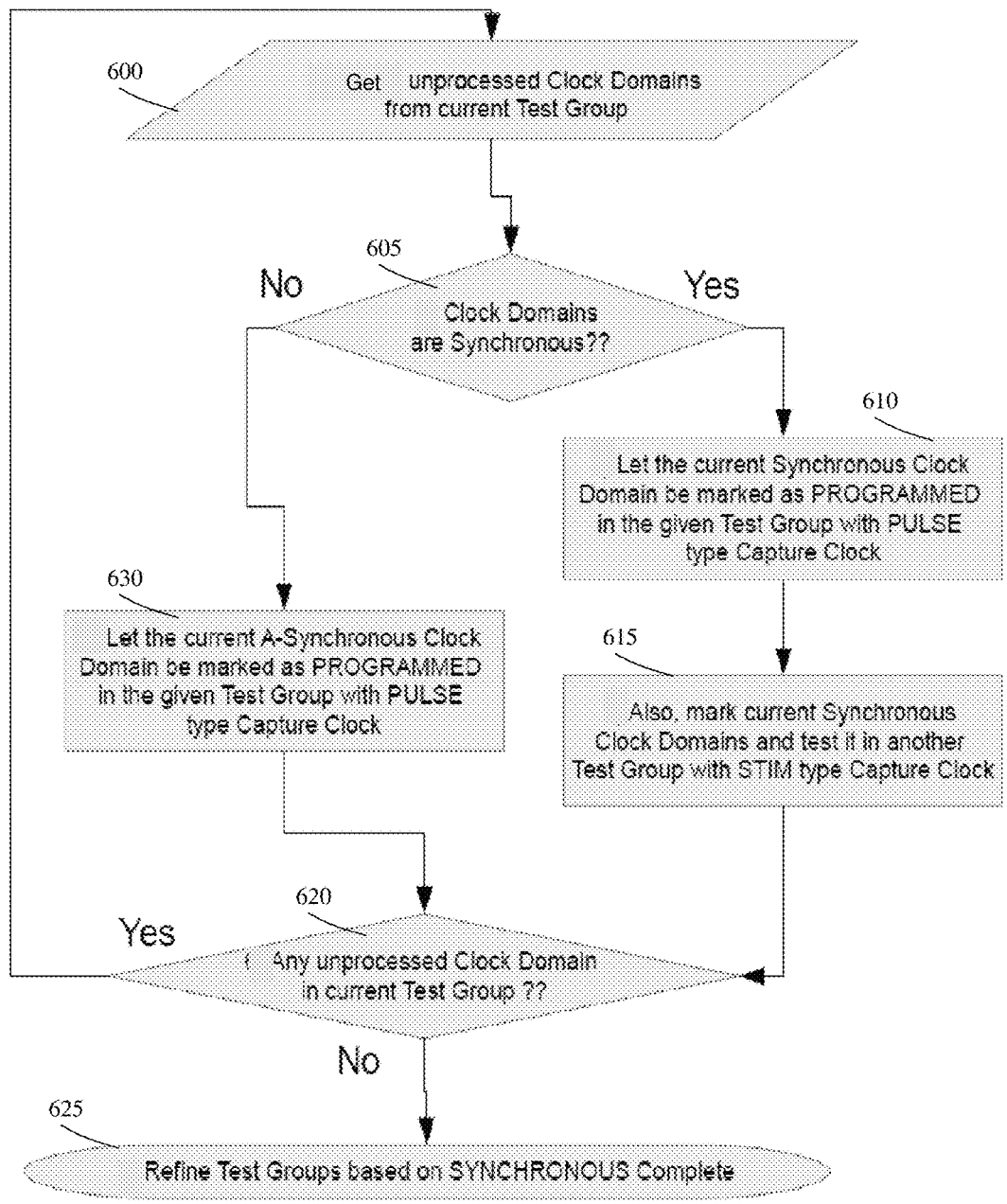
FIG. 6 depicts an exemplary flow for refining a current test group based on SYNCHRONOUS attributes in accordance with aspects of the present disclosure.

FIG. 6 depicts an exemplary flow for refining a current test group based on SYNCHRONOUS attributes in accordance with aspects of the present disclosure. At step 600, the processes obtain unprocessed clock domains from the current test group. At step 605, a determination is made as to whether the clock domains are synchronous. If yes, then the processes continue to step 610, where the current synchronous clock domain is marked as PROGRAMMED in the given test group with PULSE type capture clock. At step 615, the processes also mark current synchronous clock domains and test it in another test group with STIM type capture clock. At step 620, the processes determine whether any unprocessed clock domain is in the current test group. If there are unprocessed clock domains, the process will revert back to step 600. If not, then the refinement of the test groups based on SYNCHRONOUS attribute is marked as complete.

Returning to step 605 of FIG. 6, if the clock domains are not synchronous, the processes continue to step 630. At step 630, the processes will mark the current asynchronous clock domain as PROGRAMMED in the given test group with PULSE type capture clock. The process will then continue to step 620.

Figure 7:
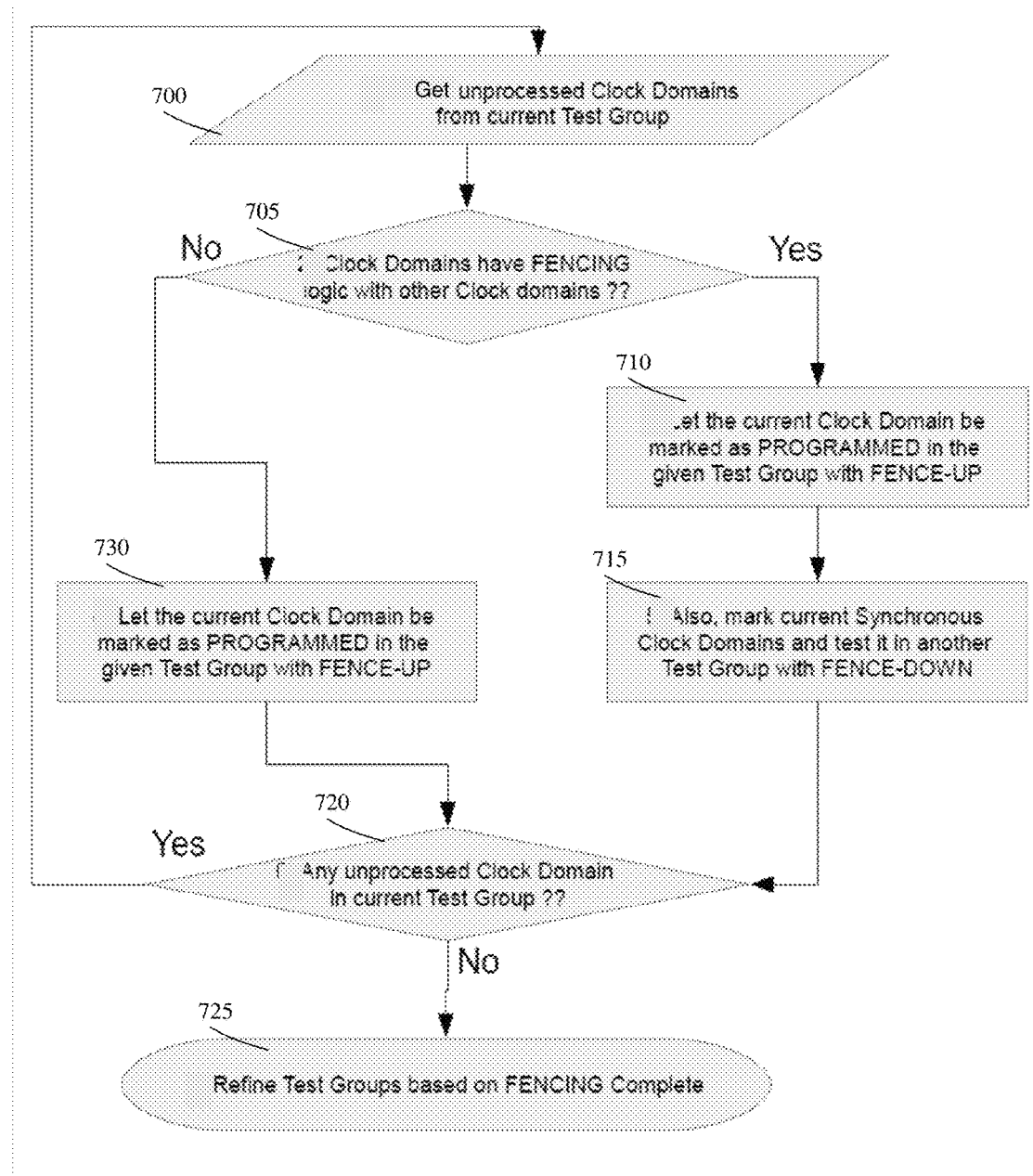
FIG. 7 depicts an exemplary flow for refining a current test group based on SYNCHRONOUS attributes in accordance with aspects of the present disclosure.

FIG. 7 depicts an exemplary flow for refining a current test group based on SYNCHRONOUS attributes in accordance with aspects of the present disclosure. At step 700, the processes obtain unprocessed clock domains from the current test group. At step 705, a determination is made as to whether the clock domains have FENCING logic with other clock domains. If yes, at step 710, the processes let the current clock domain be marked as PROGRAMMED in the given test group with FENCE-UP. At step 715, the processes will also mark the current synchronous clock domains and test it in another test group with FENCE-DOWN. At step 720, a determination is made as to whether any unprocessed clock domain is in the current test group. If yes, the processes revert to step 700. If not, at step 725, the refinement of the test groups based on FENCING is marked as complete.

Returning to step 705 of FIG. 7, if the clock domains do not have FENCING logic with other clock domains, the processes continue to step 730. At step 730, the current clock domain can be marked as PROGRAMMED in the given test group with FENCE-UP. The processes continue to step 720.

Figure 8:
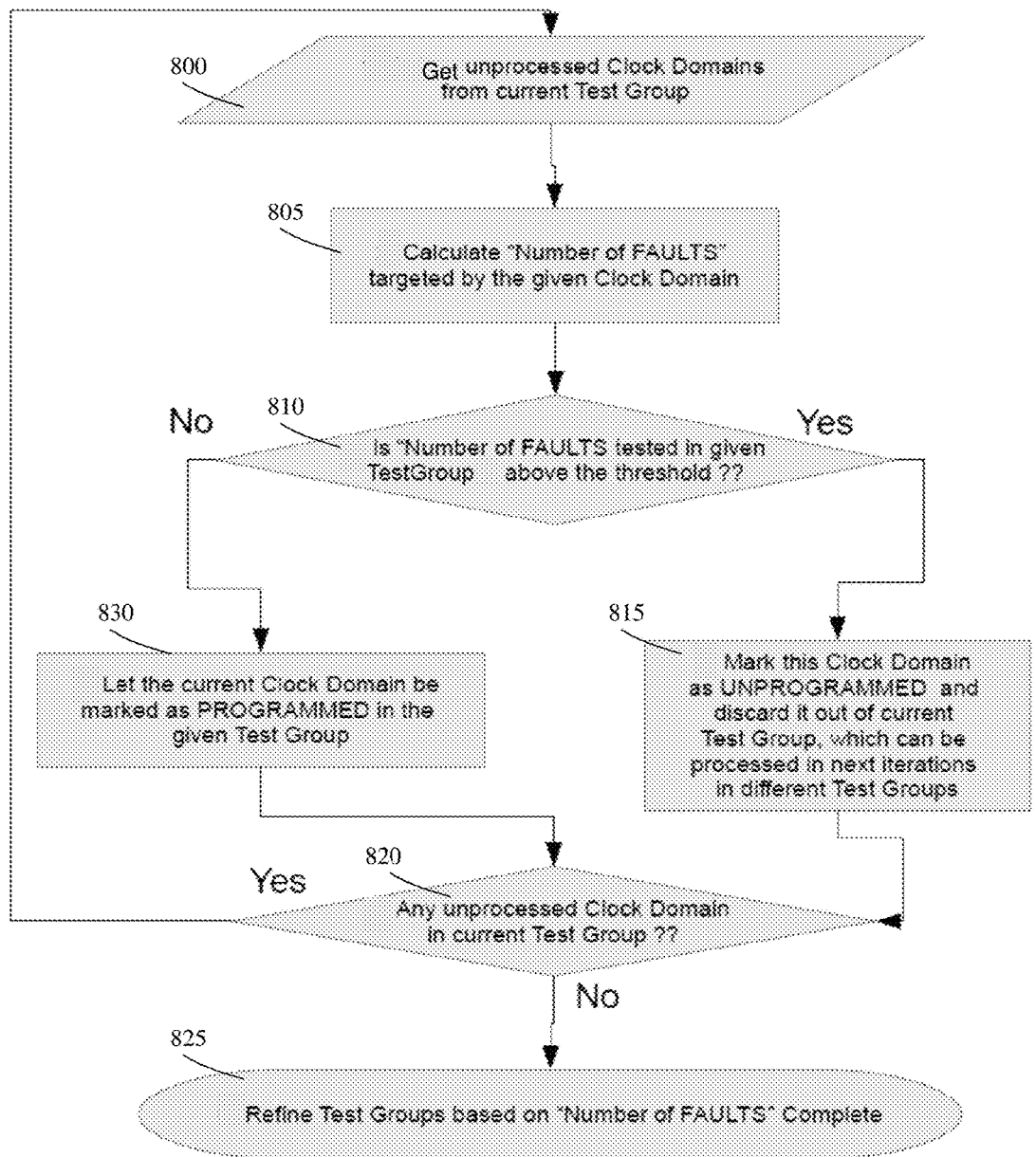
FIG. 8 depicts an exemplary flow for refining a current test group based on "Number of FAULTS" attributes in accordance with aspects of the present disclosure.

FIG. 8 depicts an exemplary flow for refining a current test group based on "Number of FAULTS" attributes in accordance with aspects of the present disclosure. At step 800, the processes obtain unprocessed clock domains from the current test group. At step 805, the processes calculate the "Number of FAULTS" targeted by the given clock domain. At step 810, the processes determine whether the number of FAULTS tested in the given test group is above the threshold. If yes, at step 815, the processes mark this clock domain as UNPROGRAMMED and discard it out of the current test group, which can be processed in next iterations in different test groups. At step 820, the processes determine whether any unprocessed clock domain is in the current test group. If yes, the processes return to step 800. If there are no unprocessed clock domains in the current test group, then at step 825, the refinement of the test groups based on "Number of FAULTS" is marked as complete.

Returning to step 810 of FIG. 8, if the "Number of FAULTS tested in given test group is not above the threshold, the process continues to step 830. At step 830, the processes let the current clock domain be marked as PROGRAMMED in the given test group. The processes continue to step 820.

Figure 9:
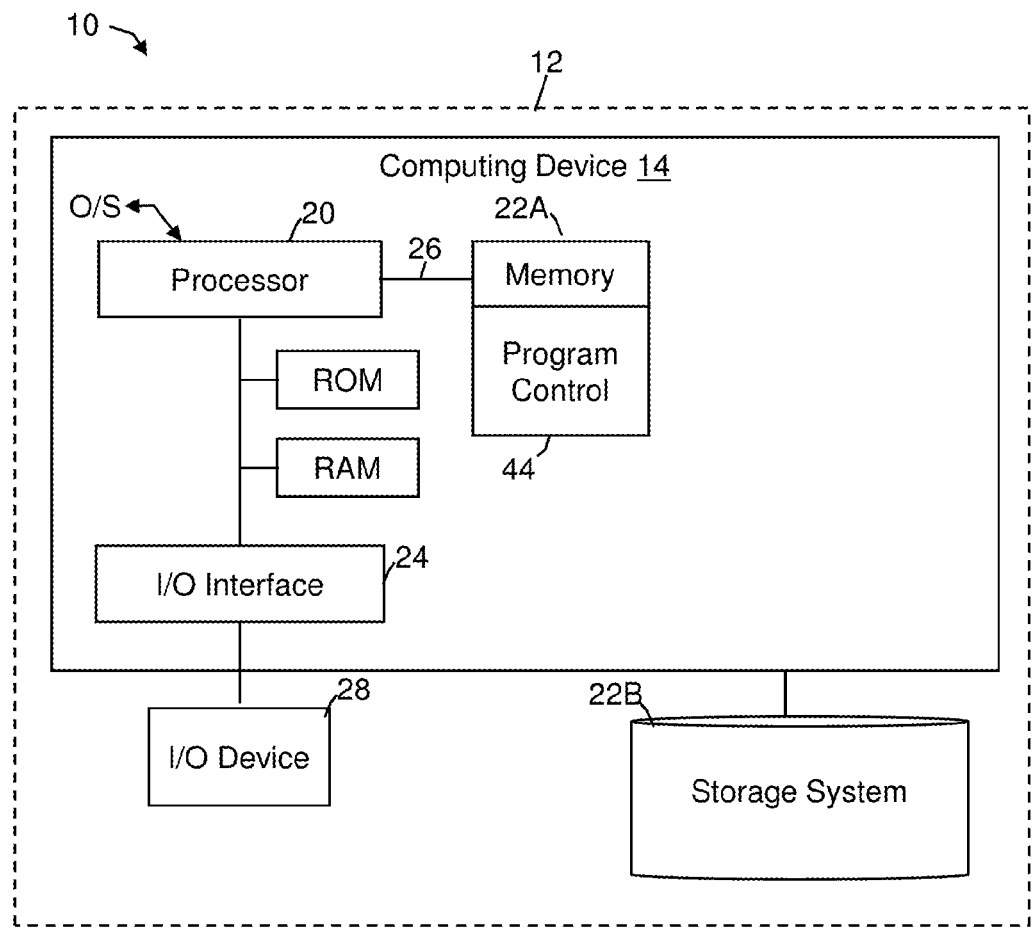
FIG. 9 is an illustrative environment for implementing the steps in accordance with aspects of the invention.

FIG. 9 shows an illustrative environment 10 for managing the processes in accordance with the invention. To this extent, the environment 10 includes a server 12 or other computing system that can perform the processes described herein. In particular, the server 12 includes a computing device 14. The computing device 14 can be resident on a network infrastructure or computing device of a third party service provider (any of which is generally represented in FIG. 9).

The computing device 14 also includes a processor 20 (e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 controls the processes described herein. The program control 44 can be implemented as one or more program code in program control 44 stored in memory 22A as separate or combined modules. Additionally, the program control 44 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    defining a plurality of clock architecture attributes for a plurality of clock domains to be tested;
    assigning each one of the plurality of clock domains to one single, unique test group; and
    refining the assignment of each one of the plurality of clock domains based on the plurality of clock architecture attributes until each of the plurality of clock domains is grouped into a single current test group, the single current test group comprising different tested clock architecture attributes for each of the plurality of clock domains and, in the single current test group, each of the plurality of clock domains are marked as PROGRAMMED.

2. The method of claim 1, wherein the refining step comprises assignment of the plurality of clock domains based on whether a first clock controller is coupled to a second clock controller.

3. The method of claim 2, wherein the refining step comprises optimizing/determining a source of a primary clock generator (PLL) for each one of the plurality of clock domains.

4. The method of claim 3, further comprising programming a frequency of the PLL based on operating frequency of at least two clock controllers.

5. The method of claim 1, wherein the refining step comprises providing information about a reference clock for each one of the plurality of clock domains.

6. The method of claim 1, wherein the refining step comprises determining an operating frequency of a primary clock generator (PLL) associated with each one of the plurality of clock domains.

7. The method of claim 6, further comprising identifying when two clock controllers are sourced by a same frequency of operation, and wherein a single PLL cannot be programmed to two different frequencies under a same test group.

8. The method of claim 1, wherein the refining step comprises providing information about a frequency division operation performed by an associated clock controller for each one of the plurality of clock domains.

9. The method of claim 8, further identifying when clock controllers are doing division by themselves and, when so, identifying a frequency of operation of two operating clock controllers and identifying synchronous behavior, domain crossing and fencing logic.

10. The method according to claim 1, wherein the refining step comprises identifying synchronous operation of any two clock controllers for each one of the plurality of clock domains.

11. The method according to claim 10, wherein:
    when the two clock controllers are part of a same test group, checking for any domain crossing between them and in case the domain crossing is found, checking for synchronous behavior;
    when the two clock controllers are synchronous, testing them together with PULSE/STIM type of clocking with FENCE-UP or FENCE-DOWN; and
    when the two clock controllers are asynchronous, then testing the two clock controllers only with PULSE type of clocking with FENCE-UP.

12. The method according to claim 1, wherein the refining step comprises determining whether fencing logic is implemented to isolate any two clock controllers for each one of the plurality of clock domains.

13. The method of claim 12, further comprising checking for the fencing logic on a given cross domain path and determining when PULSE/STIM type of clocking is possible with FENCES UP or FENCES DOWN, wherein when no fencing logic is available on the domain crossing paths, the two clock controllers are not to be tested under a same test group when they are asynchronous.

14. The method according to claim 1, wherein the refining step comprises determining a number of faults targeted by the plurality of clock domains.

15. A computer program product comprising a computer readable storage medium having program instructions embodied therewith, the program instructions executable by a computing device to cause the computing device to:
    tabulate, by the computing device, clock architecture attributes for all clock domains associated with a test;

mark, by the computing device, all clock domains with an UNPROGRAMMED attribute;

place, by the computing device, all UNPROGRAMMED clock domains into one single unique test group and mark all of them with a PROGRAMMED attribute; and refine, by the computing device, the unique test group into a single current test group which includes different tested clock architecture attributes for each of the clock domains of the single unique test group based on the clock architecture attributes until all of the clock domains to be tested are PROGRAMMED and marked as completed.

16. The computer program product of claim 15, wherein the clock architecture attributes include REFCLK, FREQ, PLL_SOURCE, FENCING, CASCADING, SYNC, and NODES.

17. The computer program product of claim 16, wherein the refining uses each of the clock architecture attributes.

18. The computer program product of claim 16, wherein the refining uses any of the clock architecture attributes.

19. A system comprising:

a CPU, a computer readable memory and a computer readable storage medium;

program instructions to tabulate clock architecture attributes for all clock domains associated with a test;

program instructions to place all UNPROGRAMMED clock domains into a single, unique test group;

program instructions to refine the single, unique test group into a single current test group based on different clock architecture attributes, by a computing device, based on the clock architecture attributes until all of the clock domains to be tested are PROGRAMMED and marked as completed, wherein the single current test group includes different tested clock architecture attributes for each of the clock domains; and program instructions to mark the clock domains as PROGRAMMED in the single, unique test group, wherein the program instructions are stored on the computer readable storage medium for execution by the CPU via the computer readable memory.

20. The system of claim 19, wherein the clock architecture attributes include REFCLK, FREQ, PLL_SOURCE, FENCING, CASCADING, SYNC, and NODES.

* * * * *